United States Patent
Waitl et al.

(10) Patent No.: US 6,560,857 B1
(45) Date of Patent: May 13, 2003

(54) ASSEMBLY DEVICE

(75) Inventors: Günter Waitl, Regensburg (DE); Johann Feraric, Neubiberg (DE)

(73) Assignees: Simotech GmbH, Taufkirchen (DE); Osram Opto Semiconductors GmbH & Co. OHG, Regensburg (DE)

(*) Notice: Subject to any disclaimer, the term of this patent is extended or adjusted under 35 U.S.C. 154(b) by 0 days.

(21) Appl. No.: 09/807,291

(22) PCT Filed: Aug. 11, 2000

(86) PCT No.: PCT/EP00/07838

§ 371 (c)(1),
(2), (4) Date: May 10, 2001

(87) PCT Pub. No.: WO01/13697

PCT Pub. Date: Feb. 22, 2001

(30) Foreign Application Priority Data

Aug. 11, 1999 (EP) .............................. 99115834

(51) Int. Cl.$^7$ ................................................. B23P 19/00
(52) U.S. Cl. ........................... 29/740; 29/729; 438/106; 414/226.04
(58) Field of Search ................................. 438/106, 109; 29/729, 740, 759; 414/225.01, 226.01, 226.04

(56) References Cited

U.S. PATENT DOCUMENTS

| | | | |
|---|---|---|---|
| 4,393,579 A | | 7/1983 | Van Hooreweder .......... 29/740 |
| 5,040,291 A | * | 8/1991 | Janisiewicz et al. .......... 29/840 |
| 5,523,591 A | * | 6/1996 | Fleming et al. ................ 257/91 |
| 5,739,800 A | * | 4/1998 | Lebby et al. .................. 345/82 |
| 5,747,363 A | * | 5/1998 | Wei et al. ....................... 438/5 |
| 5,840,594 A | * | 11/1998 | Tsubouchi et al. ............. 438/15 |
| 6,399,937 B1 | * | 6/2002 | Huang et al. ................ 250/216 |

FOREIGN PATENT DOCUMENTS

| | | |
|---|---|---|
| EP | 0 582 086 A1 | 7/1993 |
| WO | WO 98/32160 | 7/1998 |

OTHER PUBLICATIONS

"Substrate Carrier Assembly for Robot Operations", IBM Technical Disclosure Bulletin, vol. 33, No. 3A, Aug. 1, 1990, pp. 259–260.

* cited by examiner

Primary Examiner—Pamela Wilson
(74) Attorney, Agent, or Firm—Weingarten, Schurgin, Gagnebin & Lebovici LLP

(57) ABSTRACT

An assembly device, in particular a fully automatic assembly device for producing microsystem technical products and for assembling components in the semiconductor industries, comprising an assembly table, a material transport system that transports the products to be placed with components, at least one transport system mounted on the assembly table, and at least one movable component transport unit with at least one assembly head. The component transport unit(s) is/are arranged on one or more carrier system(s) displaceable by means of a transport system in parallel to the direction of transport of the products to be placed with components, which products are in turn displaced by the material transport system(s). The material transport system consists of at least two individual transport systems that run parallel, each individual transport system being provided with separately controllable drive systems, and the assembly device in addition comprising at least one information memory for receiving and processing component-specific data of a plurality of components within a component reservoir, and of data relative to the position thereof within the component reservoir, the control of the component transport unit(s) and/or the assembly table and of the thereon attached material transport system ensuing on the basis of these data.

26 Claims, 1 Drawing Sheet

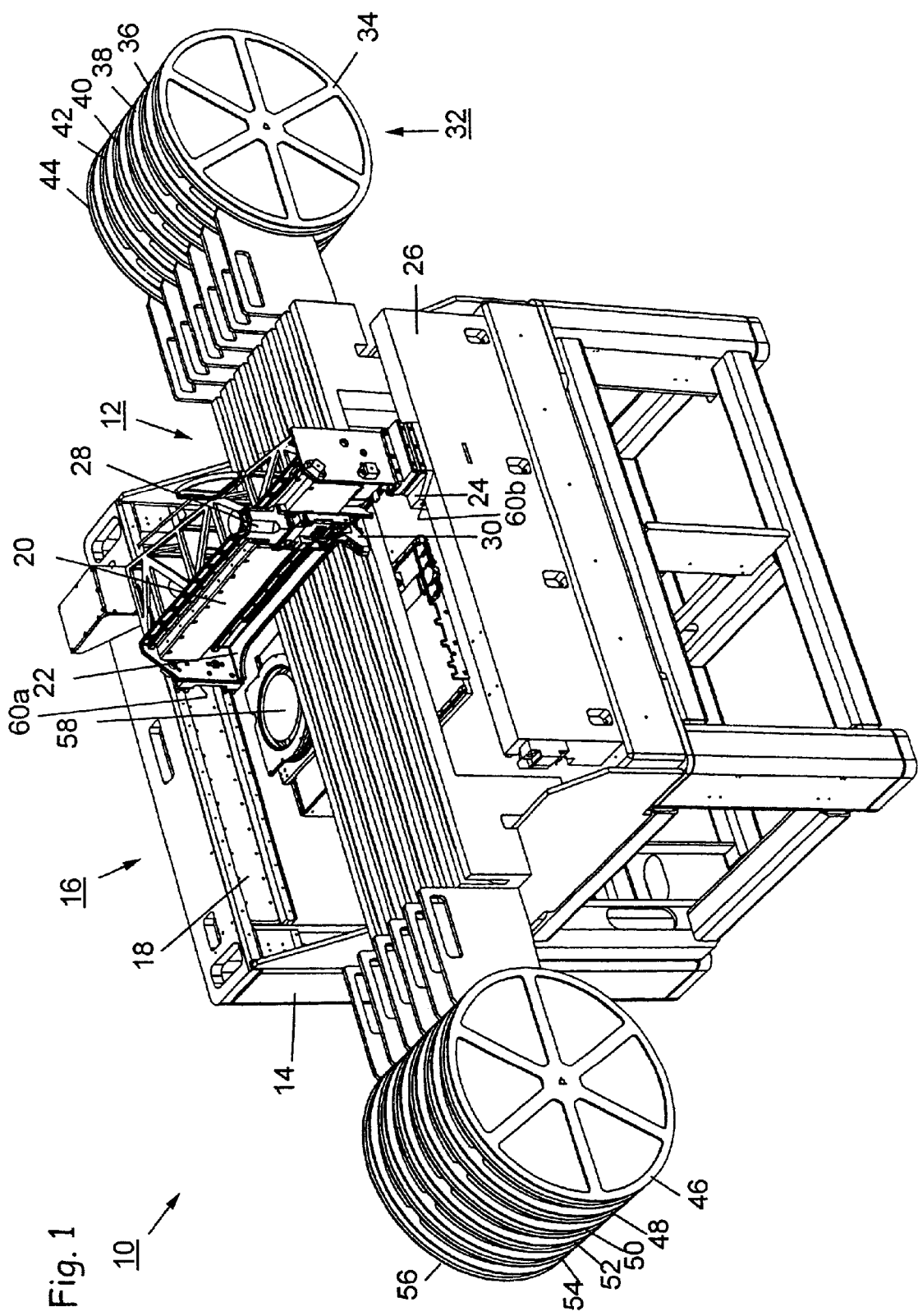

ASSEMBLY DEVICE

The present invention relates to an assembly device, in particular a fully automatic assembly device for producing microsystem technical products and for assembling components in the semiconductor industries, comprising an assembly table, at least one material transport system that transports the products to be placed with components, at least one transport system mounted on the assembly table, and at least one movable component transport unit with at least one assembly head. The present invention moreover relates to a method for assembling and producing microsystem technical products.

Such assembly devices are known from prior art. Known generic assembly devices can be classified in three main categories: Assemblers/inserters for producing electronic components, assembly automates for the semiconductor industry and laboratory devices for the assembly of samples of microsystem technical demonstration models. Such assembly devices, however, exhibit manifold disadvantages in particular for the production of microsystems.

Thus, with the production of functional units on the basis of microsystem technical component, the necessity exists increasingly to only use components of approximately identical quality for a determined production batch.

With the production of lighting fixtures based on LEDs, more and more care is taken that only those LEDs are processed together, which emit light in the same frequency spectrum and with the same intensity. Therewith, it is intended to be secured that with a posterior use in products, there do not arise any remarkable differences between the individual, adjacent and packed LEDs. The problem in this is that already on a single wafer as a standard delivery form of the LEDs, these emit lights in various bandwidths, so that even LEDs of one wafer do not exhibit the same characteristic features.

With the previous production of lighting fixtures based on LEDs, these are, as a rule, mounted from the wafer by so-called die bonders separately and into specific housings. Die bonders process the LED-carrying wafers without taking into account the differences in the physical characteristics of the individual LEDs. Previous die bonders moreover process only separate bands, which carry the housings of the LEDs either on a single track or on several tracks. In this processing form, LEDs possibly having quite different properties are put on one band. The consequences are quality leaps on the individual band. So as to avoid these quality differences and to be able to simultaneously use conventionally working die bonders in the assembly, sorting machines are increasingly used. Their task consists in taking the LEDs, which are identical with respect to their properties, over from the individual wafer, and to apply them on an intermediate carrier, e.g. an artificial wafer. For the implementation of the sorting process, basic information containing the information relative to the properties of the different individual LEDs is needed. This basic information may, for example, be provided as "wafer maps", when components of the semiconductor industry such as LEDs are processed. Basic information, however, can be present in any optional format or can be made available in any optional manner. Thus, for example, LEDs having identical properties are localized. So as to generate these "wafer maps" the individual wafers are measured outside of the sorting machines, and the measured values are electronically stored. After the sorting machine has worked off one wafer, the next one is loaded. This sorting process continues until the first intermediate carrier or artificial wafer is filled and is substituted by a new intermediate carrier or artificial wafer, which is not yet charged. After a sufficient number of intermediate carriers or artificial wafers carrying LEDs each of the same class (quality) are present, commences the above-mentioned processing in a die bonder. The LEDs are mounted from the intermediate carriers or artificial wafers separately and on one separate band. Due to the pre-sorting process, only wafers of identical quality get on one band. Thereby, it is, however, disadvantageous that for processing a new quality class of LEDs, the respective artificial wafer, as well as the related band on the die bonder, have to be exchanged. It is true that by such a processing by means of a separate pre-sorting, the principal problem is solved by mounting only LEDs of one class on one band, it is, however, disadvantageous that a separate sorting machine is required, which is relatively expensive and works slowly. Moreover, a material handling between two different machine types is necessary, namely the sorting machine and the subsequent die bonder. Furthermore, the operator has to determine the allocation between the wafer, the intermediate carrier or artificial wafer, and the band. Hence, the risk of confusion increases with the increasing number of quality classes. Finally, various material implementations have to be carried out: On the sorting machine the various wafers and the various intermediate carriers, and on the die bonder the intermediate carriers and the bands. This necessity decelerates the production flow. A further disadvantage is that in particular for the intermediate carriers, additional carrier materials are used. In the light of ecology, this represents an additional environmental issue.

The die bonders used nowadays in the semiconductor industry do not satisfy the requirements of a quality-orientated assembly or an assembly and sorting in one working cycle. The known die bonder configurations do not offer sufficient space available due to their basic structure, so as to allow, for example, that several separately driven material transport units could be used. In particular, the basic structure of these die bonders is so selected that a sufficient assembly precision combined with a high assembly speed in combination with available space, entailing flexibility by a free configurability, is not possible.

It is therefore the object of the present invention to provide for a generic assembly device that allows the assembly and sorting of microsystem technical components in one working cycle with high productivity and assembly precision.

This task is solved by an assembly device having the features pursuant to claim 1.

Advantageous configurations are described in the sub-claims.

With an inventive assembly device, a component transport unit or component transport units is/are arranged on one or more carrier system/s, displaceable by means of a transport system in parallel to the direction of transport of the products to be placed with components, which products are in turn displaced by a material transport system/s, and the material transport system consists of at least two individual transport systems that run parallel, each individual transport system being provided with separately controllable drive systems, and the assembly device in addition comprising at least one information memory for receiving and processing component-specific data of a plurality of components within a component reservoir, and of data relative to the position thereof within the component reservoir, the control of the component transport unit/s and/or the assembly table and of the thereon attached material transport system ensuing on the basis of these data.

Due to the inventive arrangement of the carrier system and the material transport system, it is possible to mainly move only the assembly head and/or the assembly table for the material transportation. The carrier system itself thereby only carries out a short balancing movement in certain assembly modes, so that relatively small masses have to be moved. Thereby, the assembly head can be moved at a higher speed, which in turn leads to higher throughput rates at an increased assembly precision. It is moreover possible to execute larger transport movements by a displacement of the carrier systems, so that the entire available surface of the assembly table can be covered, hence enabling a high component or substrate variation. Furthermore, due to the carrier systems displaceable in parallel and arranged perpendicular to the direction of the material transport system, it becomes possible that materials of a high width and products of a high width to be placed with components, respectively, can be processed. Preferably, several individual transport systems can be arranged in the assembly device, so that the placement speed and the placement variation is distinctly increased. Pursuant to the component-specific information present, the assembly of the component on the thereto corresponding individual transport system ensues with the respective product to be placed with components. In an advantageous manner, the necessity of a separate and expensive sorting machine is omitted with the inventive system. Processing moreover ensues on one machine, so that the material handling between machines of a different type is superfluous. Finally, the allocation component/individual transport system or product is executed automatically. Furthermore, a multitude of material settings is cancelled in an advantageous manner, so that the production result is clearly improved. Even necessary additional carrier materials are cancelled, since it is worked without intermediate carrier. Due to the portal-like structure, the space available on the assembly table moreover remains maintained, which is an advantageous fact as to accessibility, adaptability and free configurability.

In an advantageous configuration of the inventive assembly device, the component reservoir is configured displaceable. Thus, the allocation speed of the separate components in the component reservoir to a determined delivery position can be considerably increased. It could even be imagined that only the component reservoir is still to be moved and the carrier system/s remain/s immobile.

In another advantageous configuration of the inventive assembly device, the transport system is comprised of a rail displaceable in a machine frame of the assembly device in parallel to the direction of transport of the products to be placed with components, which products are in turn displaced by the material transport system/s, whereby at least one carrier system engages perpendicularly into said rail, so that the carrier system/s is/are displaceable. Thereby, reaction forces from the movement of the component transport unit are diverted in an optimized manner. Occurring vibrations are minimized by means of the improved power flux.

In a further advantageous configuration of the invention, the carrier system or the carrier, comprises a bearing at its end lying opposite to the rail, said bearing coming to rest on a counter-bearing configured in the machine frame and in parallel to the rail. Thereby, the space available on the assembly level is increased again. In addition, the accessibility of the assembly device and the free configurability thereof is enhanced.

In a further advantageous configuration of the inventive assembly device, the mutual movements of several carriers can be synchronized. Thus, the production speed can be considerably increased. By a dynamically optimized synchronization of several carrier systems in their respective movements, a distinct reduction of machine vibrations can be achieved (dynamic balancing), by means of which the assembly accuracy can be further increased.

In a further advantageous configuration of the invention, it is also possible to arrange several carrier systems one above the other. Such an arrangement increases the number of assembly levels, which in turn leads to an increase of the production speed and to a still higher flexibility with respect to the application fields of the inventive assembly device.

The invention moreover relates to a method for mounting and producing microsystem technical products with the use of an inventive assembly device, said method comprising the following steps: (a) receiving and processing component-specific data of a plurality of components in a component reservoir, and of data with respect to their position within the component reservoir in an information memory of the assembly device, and (b) controlling one or more component transport unit/s and/or an assembly table of the assembly device on the basis of these data in such a way that the components are received and processed according to the statistical distribution of their component-specific data. For example, components having the most frequently present and comparable component-specific data can be taken from the component reservoir, and can be put or mounted on an individual transport system of the material transport system lying closest to the component reservoir. A distinct rate/time optimization results thereby in an advantageous manner, and hence, there is an increase in the placement speed.

The invention relates also to a method for mounting LED chips on lead frame bands with the use of an embodiment of the inventive assembly device, whereby LED chips are successively taken from the wafer or the epitaxy wafer by the component transport unit on the basis of the data stored in the information memory, and are put onto one of several lead frame bands running side by side on the assembly table, in a manner that lead frame bands with LED chips are generated, which belong to the same component group with respect to their component-specific data. For this purpose as well, LED chips having the most frequently present and comparable component-specific data can first be taken from the epitaxy wafer, and can be put or mounted onto the lead frame of a lead frame transport system lying closest to the epitaxy wafer.

Further details, features and advantages of the invention result from the following description of a graphically represented embodiment.

The FIGURE shows an assembly device 10, in particular for the use as a fully automatic assembly device for producing microsystem technical products and for assembling components in the semiconductor industries. The assembly device 10 comprises an assembly table 12. A transport system 16 is arranged on the assembly table 12. The transport system 16 is comprised of a rail 18 arranged displaceably in a machine frame 14 of the assembly device 10 in parallel to the direction of transport of the products to be placed with components, which products are in turn displaced by the material transport system 32, one carrier system carrier 22 of a carrier system 20 engaging perpendicularly in the rail 18, so that the carrier system 20 is displaceable. The carrier system 20 and the carrier 22, respectively, thereby comprises a bearing 24 at its end lying opposite to the rail 18, which bearing comes to rest on a counter-bearing 26 formed in the machine frame 14 and arranged in parallel to the rail 18. In a further, not shown embodiment, the entire counter-bearing can be renounced of. The transport system 16 furthermore comprises carrier system drives 60a and 60b.

It is moreover possible that the movements of several carrier systems can be mutually synchronized, and that several carrier systems are arranged one above the other (not shown). The movements of several carrier systems can thereby be so co-ordinated that different assembly operations can be executed in a predetermined order.

The carrier system carrier 22 comprises an oblong engagement opening in its longitudinal direction, in which a component transport unit 28 gets into engagement and is movably guided. On the component transport unit 28, an assembly head 30 is movably and releasably attached.

In the illustrated embodiment, LEDs or LED chips are used as components, which are processed into LED-based lighting fixtures.

One recognizes that the carrier system 20 is displaceable in parallel to the direction of the material transport. The material or product transport ensues by means of a material transport system 32, which is likewise arranged in the area of the assembly level or table level. Furthermore, it becomes evident that the material transport system 32 is comprised of several individual transport systems 34, 36, 38, 40, 42, 44, that run parallel, each individual transport system 34, 36, 38, 40, 42, 44 being provided with separately controllable drive systems 46, 48, 50, 52, 54, 56. In the exemplary embodiment, the material transport system 32 is a band or belt transport system having several individual bands or belts arranged parallel to each other. The band or belt transport system can for example be a lead frame transport system.

The assembly device 10 moreover comprises at least one (not shown) information memory for receiving and processing component-specific data of a plurality of components in the component reservoir 58, and of data with respect to their position within the component reservoir 58, the component transport unit(s) 28 being controlled on the basis of these data. The component reservoir 58 thereby consists of one wafer. The data received and processed in the information memory are so-called "wafer maps", in which the component-specific data of each component or LED chip, and the respective associated position of the component or the LED chip on the wafer is contained.

The wafer can moreover comprise a separated epitaxy wafer, in which the position of the individual LED chips has remained unchanged as of the epitaxy precipitation in a LED layer formation and their separation into individual LED chips.

What is claimed is:

1. Assembly device, in particular a fully automatic assembly device for producing microsystem technical products and for assembling components in the semiconductor industries, comprising an assembly table, at least one material transport system that transports the products to be placed with components, at least one transport system mounted on the assembly table, and at least one movable component transport unit with at least one assembly head, characterized in that
    at least one component transport unit is arranged on at least one carrier system displaceable by means of a transport system in parallel to the direction of transport of the products to be placed with components, which products are in turn displaced by the at least one material transport system, and the material transport system consists of at least two individual transport systems that run parallel, each individual transport system being provided with separately controllable drive systems, and the assembly device in addition comprising at least one information memory for receiving and processing component-specific data of a plurality of components within a component reservoir, and of data relative to the position thereof within the component reservoir, the control of the at least one component transport unit and the assembly table and of the material transport system ensuing on the basis of these data.

2. Assembly device according to claim 1, characterized in that the component reservoir is configured displaceable.

3. Assembly device according to claim 2, wherein the transport system is comprised of a rail arranged in a machine frame of the assembly device, movable in parallel to the direction of transport of the products to be placed with components, which products are in turn displaced by the material transport system, at least one carrier engaging perpendicularly into the rail, so that the at least one carrier system is displaceable.

4. Assembly device according to claim 1, wherein the transport system is comprised of a rail arranged in a machine frame of the assembly device, movable in parallel to the direction of transport of the products to be placed with components, which products are in turn displaced by the material transport system, at least one carrier engaging perpendicularly into the rail, so that the at least one carrier system is displaceable.

5. Assembly device according to claim 4, characterized in that
    the at least one carrier system and the carrier, respectively, comprise a bearing on its end lying opposite to the rail, the bearing coming to rest on a counter-bearing arranged in the machine frame and in parallel to the rail.

6. Assembly device according to claim 1, characterized in that the transport system comprises at least one carrier system drive.

7. Assembly device according to claim 1, characterized in that the movements of several carrier systems can be mutually synchronized.

8. Assembly device according to claim 1, characterized in that the components are LEDs and LED chips, respectively, and the products to be placed with components are LED-based lighting fixtures.

9. Assembly device according to claim 8, wherein the component reservoir is comprised of at least one wafer; and the wafer comprises a separated epitaxy wafer, in which the position of the individual LED chips has remained unchanged as of the epitaxy precipitation in a LED layer formation and their separation into individual LED chips.

10. Method for mounting LED chips on lead frame bands with the use of an assembly device according to claim 9, wherein the LED chips are successively taken from the wafer by the component transport unit on the basis of the data stored in the information memory, and are put onto one of several lead frame bands running side by side on the assembly table, in a manner that lead frame bands with LED chips are generated, which belong to the same component group with respect to their component-specific data.

11. Method according to claim 10, characterized in that LED chips having the most frequently present and comparable component-specific data are first taken from the epitaxy wafer, and are put or mounted on a lead frame band of a lead frame transport system lying closest to the epitaxy wafer.

12. Assembly device according to claim 9, wherein the data received and processed in the information memory are "wafer maps", in which the component-specific data of each component and LED chip, respectively, and the respective associated position of the component on the wafer is contained.

13. Method for mounting LED chips on lead frame bands with the use of an assembly device according to claim 9, wherein the data received and processed in the information memory are "wafer maps", in which the component-specific data of each component and LED chip, respectively, and the respective associated position of the component on the wafer is contained; and the LED chips are successively taken from the wafer by the component transport unit on the basis of the data stored in the information memory, and are put onto one of several lead frame bands running side by side on the assembly table, in a manner that lead frame bands with LED chips are generated, which belong to the same component group with respect to their component-specific data.

14. Method for mounting LED chips on lead frame bands with the use of an assembly device according to claim 9, wherein the LED chips are successively taken from the epitaxy wafer by the component transport unit on the basis of the data stored in the information memory, and are put onto one of several lead frame bands running side by side on the assembly table, in a manner that lead frame bands with LED chips are generated, which belong to the same component group with respect to their component-specific data.

15. Assembly device according to claim 9, wherein the data received and processed in the information memory are "wafer maps", in which the component-specific data of each component and LED chip, respectively, and the respective associated position of the LED chip on the wafer is contained.

16. Method for mounting LED chips on lead frame bands with the use of an assembly device according to claim 9, wherein the data received and processed in the information memory are "wafer maps", in which the component-specific data of each component and LED chip, respectively, and the respective associated position of the LED chip on the wafer is contained; and the LED chips are successively taken from the wafer by the component transport unit on the basis of the data stored in the information memory, and are put onto one of several lead frame bands running side by side on the assembly table, in a manner that lead frame bands with LED chips are generated, which belong to the same component group with respect to their component-specific data.

17. Assembly device according to claim 1, characterized in that the material transport system is a band transport system.

18. Assembly device according to claim 17, characterized in that the band transport system is a lead frame transport system.

19. Assembly device according to claim 1, characterized in that the component reservoir is comprised of at least one wafer.

20. Assembly device according to claim 19, wherein the data received and processed in the information memory are "wafer maps", in which the component-specific data of each component and LED chip, respectively, and the respective associated position of the component or the LED chip on the wafer is contained.

21. Method for mounting and producing microsystem technical products with the use of an assembly device according to claim 1, characterized in that the method comprises the following steps:

a) receiving and processing component-specific data of a plurality of components in a component reservoir, and of data with respect to their position within the component reservoir in an information memory of the assembly device; and b) controlling at least one component transport unit of the assembly device on the basis of these data in such a way that the components are taken from the component reservoir and processed according to the statistical distribution of their component-specific data.

22. Method according to claim 21, characterized in that in the method step b), components having the most frequently present and comparable component-specific data can first be taken from the component reservoir, and can be put on an individual transport system of a material transport system device lying closest to the component reservoir.

23. Method according to claim 21, characterized in that in the method step b), components having the most frequently present and comparable component-specific data can first be taken from the component reservoir, and can be mounted on an individual transport system of a material transport system device lying closest to the component reservoir.

24. Assembly device according to claim 1, characterized in that the material transport system is a belt transport system.

25. Assembly device according to claim 24, characterized in that the belt transport system is a lead frame transport system.

26. Method for mounting and producing microsystem technical products with the use of an assembly device according to claim 1, characterized in that the method comprises the following steps:

a) receiving and processing component-specific data of a plurality of components in a component reservoir, and of data with respect to their position within the component reservoir in an information memory of the assembly device; and b) controlling an assembly table of the assembly device on the basis of these data in such a way that the components are taken from the component reservoir and processed according to the statistical distribution of their component-specific data.

* * * * *